(12) United States Patent
Chen et al.

(10) Patent No.: US 11,362,074 B2
(45) Date of Patent: Jun. 14, 2022

(54) LIGHT-EMITTING DIODE DEVICE

(71) Applicant: XIAMEN SANAN OPTOELECTRONICS TECHNOLOGY CO., LTD., Xiamen (CN)

(72) Inventors: Shunyi Chen, Xiamen (CN); Junpeng Shi, Xiamen (CN); Weng-Tack Wong, Xiamen (CN); Chen-ke Hsu, Xiamen (CN); Chih-Wei Chao, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 79 days.

(21) Appl. No.: 16/878,290

(22) Filed: May 19, 2020

(65) Prior Publication Data

US 2020/0279838 A1  Sep. 3, 2020

Related U.S. Application Data

(63) Continuation-in-part of application No. PCT/CN2018/115469, filed on Nov. 14, 2018.

(30) Foreign Application Priority Data

Nov. 22, 2017 (CN) .......................... 201721568219.7

(51) Int. Cl.
*H01L 25/16* (2006.01)
*H01L 33/62* (2010.01)
(Continued)

(52) U.S. Cl.
CPC .......... *H01L 25/167* (2013.01); *H01L 33/483* (2013.01); *H01L 33/60* (2013.01); *H01L 33/62* (2013.01)

(58) Field of Classification Search
None
See application file for complete search history.

(56) References Cited

U.S. PATENT DOCUMENTS

| 10,651,353 B2 * | 5/2020 | Senuki | ..................... H01L 33/60 |
| 2013/0141920 A1 * | 6/2013 | Emerson | ................. H01L 33/58 362/311.01 |

FOREIGN PATENT DOCUMENTS

| CN | 102155936 A | 8/2011 |
| CN | 103270611 B | 12/2016 |

(Continued)

OTHER PUBLICATIONS

International Search Report for PCT/CN2018/115469. dated Feb. 20, 2019.

*Primary Examiner* — Robert K Carpenter
(74) *Attorney, Agent, or Firm* — Thomas | Horstemeyer, LLP

(57) ABSTRACT

A light-emitting diode (LED) device includes a substrate, an electrically conductive layer, a first LED chip, and an anti-electrostatic discharge element. The substrate has opposite upper and lower surfaces. The electrically conductive layer is formed on the upper surface of the substrate, and has first and second regions that are electrically separated from each other by a trench structure. The trench structure has a first segment and a second segment which connects and is not collinear with the first segment. The first LED chip is disposed across the first segment, and the anti-electrostatic discharge element is disposed across the second segment, both interconnecting the first and second regions.

17 Claims, 5 Drawing Sheets

(51) Int. Cl.
*H01L 33/60* (2010.01)
*H01L 33/48* (2010.01)

(56) References Cited

FOREIGN PATENT DOCUMENTS

CN 207818608 U 9/2018
KR 101469052 B1 * 12/2014

* cited by examiner

LIGHT-EMITTING DIODE DEVICE

CROSS-REFERENCE TO RELATED APPLICATION

This application is a bypass continuation-in-part (CIP) application of PCT International Application No. PCT/CN2018/115469, filed on Nov. 14, 2018, which claims priority of Chinese Invention Patent Application No. 201721568219.7, filed on Nov. 22, 2017. The entire content of each of the International and Chinese patent applications is incorporated herein by reference.

FIELD

This disclosure relates to a lighting device, and more particularly to a light-emitting diode (LED) device.

BACKGROUND

A light-emitting diode (LED) device is a solid-state lighting device made of semiconductor materials. With the advancement of LED technology, LED devices have been gradually developed to emit light having an emission wavelength within the ultraviolet (UV) range or even the deep ultraviolet (DUV) range.

In recent years, DUV LED devices have been widely used in various fields such as air purification and disinfection. A conventional DUV LED device usually includes a DUV flip chip that emits light from a backside of the DUV LED device to reduce light absorption of P-type gallium nitride-based materials. Compared to a conventional blue flip chip, the DUV flip chip generally has a sapphire substrate with a greater thickness, which may increase the amount of light emitted from side surfaces of the DUV flip chip. In particular, when the size of the DUV flip chip is smaller, a ratio of light emitted from the side surfaces of the DUV flip chip to that emitted from a light emitting surface thereof would be higher, causing uneven distribution of light emitted from the DUV LED device. In addition, the conventional DUV LED device has a relatively poor external quantum efficiency (EQE) and a relatively low luminous intensity, such that a major portion of electrical energy is transformed into thermal energy. Since the conventional DUV LED has a relatively poor electrostatic resistance compared to the conventional blue LED chip, an anti-electrostatic discharge element is usually placed therein. However, the anti-electrostatic discharge element is prone to malfunction and damage when exposed to heat and UV radiation from the DUV LED chip. Although it is noted that the anti-electrostatic discharge element may be directly embedded into the substrate to reduce light adsorption from the DUV LED chip, such configuration may be unfavorable for dissipating heat from the anti-electrostatic discharge element, causing acceleration of malfunction thereof.

Therefore, there is still a need to improve the luminous intensity and light distribution of an LED device, and to reduce the amount of light absorbed by components (such as the anti-electrostatic discharge element) in the LED device, so as to prevent malfunction thereof.

SUMMARY

Therefore, an object of the disclosure is to provide a light-emitting diode (LED) device that can alleviate or eliminate at least one of the drawbacks of the prior art.

According to the disclosure, the LED device includes a substrate, an electrically conductive layer, a first LED chip, and an anti-electrostatic discharge element.

The substrate has opposite upper and lower surfaces. The electrically conductive layer is formed on the upper surface of the substrate, and has a first region and a second region that are electrically separated from each other by a trench structure. The trench structure has a first segment and a second segment which connects and is not collinear with the first segment.

The first LED chip is disposed across the first segment and interconnects the first and second regions of the electrically conductive layer.

The anti-electrostatic discharge element is disposed across the second segment of the trench structure and interconnects the first and second regions of the electrically conductive layer.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
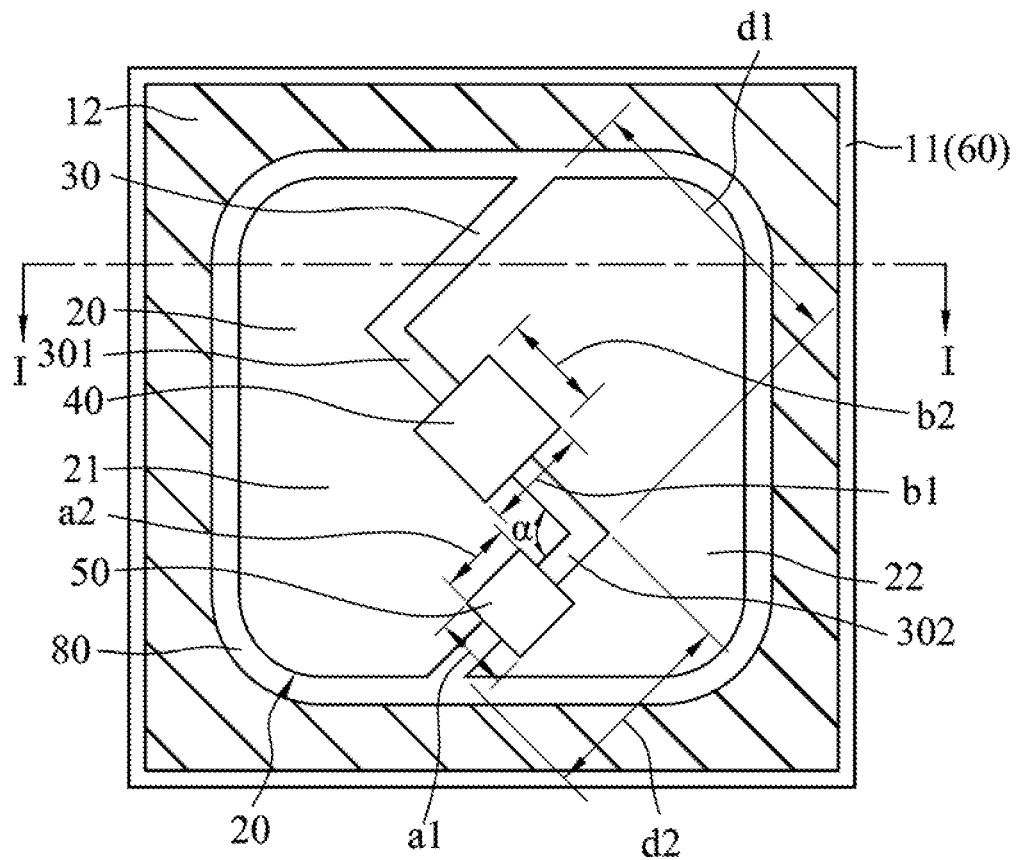
FIG. 1 is a schematic top view of a first embodiment of a light-emitting diode (LED) device of the disclosure.

Before the disclosure is described in greater detail, it should be noted that where considered appropriate, reference numerals have been repeated among the figures to indicate corresponding or analogous elements, which may optionally have similar characteristics.

Figure 2:
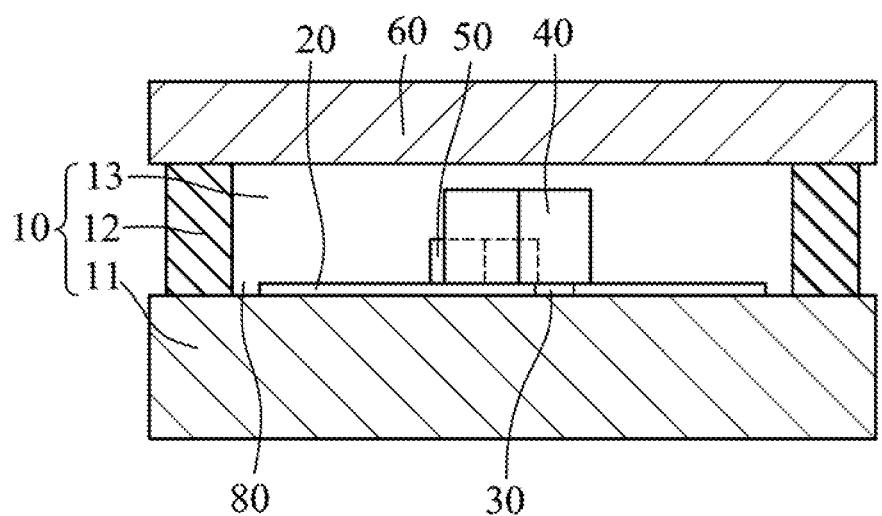
FIG. 2 is a schematic cross-sectional view of the first embodiment of the LED device taken along line I-I of FIG. 1.

Referring to FIGS. 1 and 2, a first embodiment of a light-emitting diode (LED) device according to the disclosure includes a substrate 10, an electrically conductive layer 20, a first LED chip 40, an anti-electrostatic discharge element 50, and a glass cover plate 60.

The substrate 10 includes a plate body 11 having opposite upper and lower surfaces. The electrically conductive layer 20, the first LED chip 40, and the anti-electrostatic discharge element 50 are disposed on the upper surface of the plate body 11 of the substrate 10. In this embodiment, the substrate 10 has a concavity-defining wall 12 (e.g., in a shape of a cup) extending away from the upper surface of the plate body 11 to define a concavity 13. The electrically conductive layer 20, the first LED chip 40, and the anti-electrostatic discharge element 50 are received in the concavity 13. The bottom plate 11 may be made of an electrically insulating material such as a ceramic (e.g., a low temperature co-fired ceramic (LTCC), a high temperature co-fired ceramic (HTCC), a direct plated copper (DPC) ceramic substrate, etc.). In this embodiment, the bottom plate 11 is a DPC ceramic substrate made by three-dimensional rapid prototyping, which provides an improved three-dimensional air tightness and reduces manufacturing cost. The concavity-defining wall 12 may be made of a metallic material, and may have a thickness greater than 0.3 mm.

The electrically conductive layer 20 is formed on the upper surface of the plate body 11. The electrically conductive layer 20 has a first region 21 and a second region 22 that are electrically separated from each other by a trench structure 30. The trench structure 30 has a first segment 301, and a second segment 302 which connects and is not collinear with the first segment 301. The concavity 13 of the substrate 10 has a bottom wall having a substantially rectangular shape, and the first segment 301 of the trench structure 30 may be aligned with a diagonal line of the bottom wall of the concavity 13.

As used herein, the term "substantially rectangular shape" refers to a shape with two pairs of opposing edges including short edges and long edges. A shape with rounded or sloped corners but can be assumed to be a rectangle defined by virtual lines which extend from the respective edges of the shape is also included in the term. It should be noted that the short edges may not necessarily have the same length, and one of a pair of short edges may be longer than the other. Furthermore, the long edges may not necessarily have the same length, and one of a pair of long edges may be longer than the other.

An included angle (α) between the first segment 301 and the second segment (302) of the trench structure 30 may be within a range of 60° to 120°, but is not limited thereto. In this embodiment, a channel 80 is formed between the concavity-defining wall 12 and the electrically conductive layer 20 to prevent electrical leakage. The channel 80 may have a width greater than 0.12 mm.

The first LED chip 40 and the anti-electrostatic discharge element 50 are respectively disposed across the first segment 301 and the second segment 302 of the trench structure 30, each interconnecting the first and second regions 21, 22 of the electrically conductive layer 20.

The first LED chip 40 may be a flip chip configured to emit light having a wavelength within a range of 200 nm to 380 nm. For example, the first LED chip 40 may emit light having a relatively long wavelength that ranges from 315 nm to 380 nm (i.e., UV-A), having a medium wavelength that ranges from 280 nm to 315 nm (i.e., UV-B), or having a relatively short wavelength that ranges from 200 nm to 280 nm (i.e., UV-C). The wavelength of the light to be emitted by the first LED chip 40 may be selected based on practical requirements, such as for the purpose of disinfection or UV curing. The anti-electrostatic discharge element 50 may include two electrodes facing the electrically conductive layer 20 and reflective layers coated on a side surface and an upper surface of the anti-electrostatic discharge 50 opposite to the electrically conductive layer 20. The reflective layers may be made of a metallic material, such as Al-based material, $BaSO_4$, MgO, etc.

Figure 4:
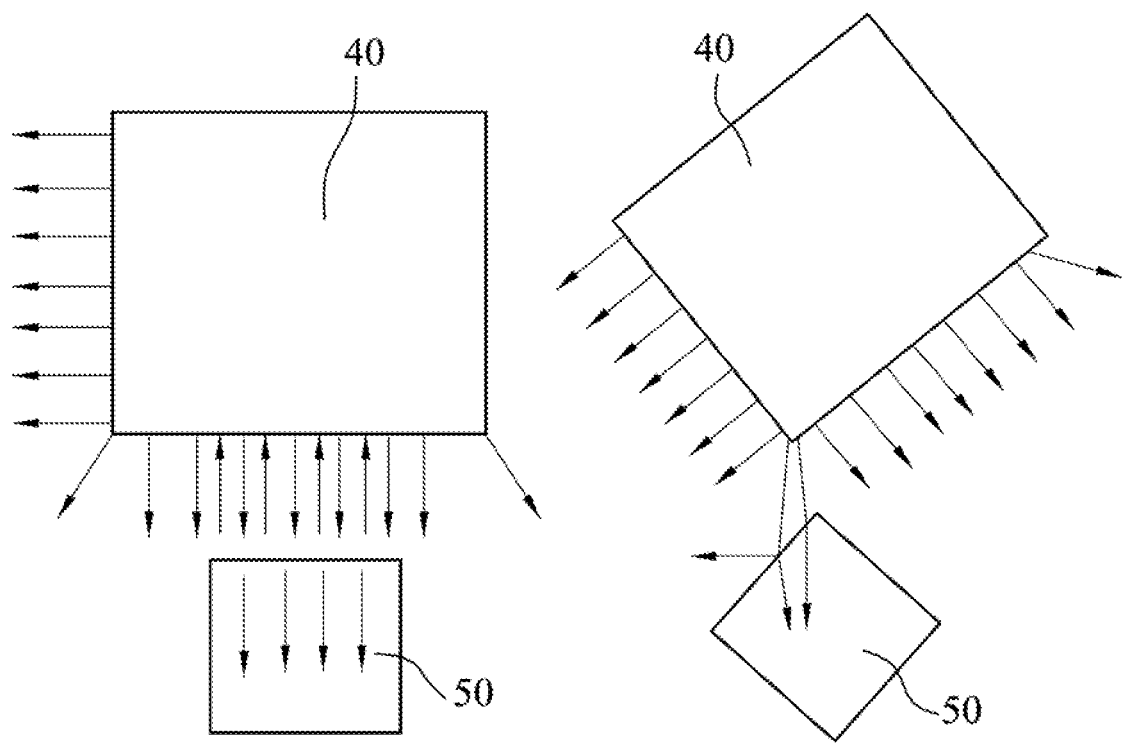
FIG. 4 is a schematic diagram illustrating a positional relationship and effect between the first LED chip and the anti-electrostatic discharge element arranged conventionally (left part) and those arranged in this disclosure (right part)

Referring to the left part of FIG. 4, a conventional positioning relationship between the anti-electrostatic discharge element 50 and the first LED chip 40 is shown. Each of the first LED chip 40 and the anti-electrostatic discharge element 50 has side surfaces and edges interconnecting the side surfaces. One of the side surfaces of the first LED chip 40 nearest to the anti-electrostatic discharge element 50 has normal lines (shown as arrows perpendicular to the side surfaces) that intersect with all points on a nearest one of the side surfaces of the anti-electrostatic discharge element 50, and an intersecting angle between any one of the normal lines and the nearest one of the side surfaces of the anti-electrostatic discharge element 50 is equal to 90°. That is, the one of the side surfaces of the first LED chip 40 and the nearest one of the side surfaces of the anti-electrostatic discharge element 50 are parallel to each other (i.e., in a side-by-side arrangement), and a projection of the one of the side surfaces of the first LED chip 40 nearest to the anti-electrostatic discharge element 50 on the anti-electrostatic discharge element 50 entirely overlaps the nearest one of the side surfaces of the anti-electrostatic discharge element 50. With such conventional positioning relationship, a large portion of light emitted from the first LED chip 40 may be absorbed by the nearest one of the side surfaces of the anti-electrostatic discharge element 50, which may result in malfunction of the anti-electrostatic discharge element 50.

To reduce the light absorbed by the side surface of the anti-electrostatic discharge element 50, in certain embodiments, the intersecting angle between any one of the normal lines on the one of the side surfaces of the first LED chip 40 and the nearest one of the side surfaces of the anti-electrostatic discharge element 50 is not equal to 90° (i.e., not in the side-by-side arrangement, see, e.g., the right part of FIG. 4). In such arrangement of this disclosure, the amount of light and heat absorbed by the side surface of the anti-electrostatic discharge element 50 may be greatly reduced, so as to prevent malfunction of the anti-electrostatic discharge element 50, thereby increasing light extraction efficiency of the LED device.

Alternatively, in other embodiments, one of the surfaces of the first LED chip 40 nearest to the anti-electrostatic discharge element 50 may have normal lines, and not all points on the one of the side surfaces of the anti-electrostatic discharge element 50 nearest to the one of the side surfaces of the first LED chip 40 are intersected by the normal lines (see, e.g., FIG. 1). In other words, the projection of the one of the surfaces of the first LED chip 40 nearest to the anti-electrostatic discharge element 50 on the anti-electrostatic discharge element 50 does not entirely overlap the nearest one of the side surfaces of the anti-electrostatic discharge element 50, so that the light and heat absorbed by the side surface of the anti-electrostatic discharge element 50 may be greatly reduced.

Referring back to FIG. 1, in this embodiment, each of a projection of the first LED chip 40 on the electrically conductive layer 20 and a projection of the anti-electrostatic discharge element 50 on the electrically conductive layer 20 has a substantially rectangular shape. The substrate 10 may also have a substantially rectangular shape, and the first LED chip 40 is disposed at a centroid of the substrate 10. An included angle between a diagonal line of the first LED chip 40 and a diagonal line of the substrate 10 may be within a range of 30° to 60°, so as to improve space utilization of the substrate 10. In this embodiment, the included angle between the diagonal line of the first LED chip 40 and the diagonal line of the substrate 10 is 45°.

The first segment 301 and the second segment 302 of the trench structure 30 respectively have a first length (d1) and a second length (d2) which satisfy relationships of:

$$d1 \geq b2 + \frac{|a1 + b1\cos\alpha|}{2\sin\alpha} \text{ and}$$

-continued $$d2 \geq a2 + \frac{|b1 + a1\cos\alpha|}{2\sin\alpha} + \frac{a1}{2\tan\left(\alpha - \frac{\pi}{4}\right)},$$

wherein α represents an included angle defined between the first segment 301 and the second segment 302, a1 and a2 respectively represent a length and a width of the anti-electrostatic discharge element 50, and b1 and b2 respectively represent a length and a width of the first LED chip 40.

When both of the first LED chip 40 and the anti-electrostatic discharge element 50 have square shapes (i.e., b2 is equal to b1 and a2 is equal to a1) and α=90°, d1≥b+(½×a) and d2≥3/2×a+½×b.

In this embodiment, the trench structure 30 has an "S" shape (see FIG. 2), and a centroid of the LED device is located on a center of the first segment 301 of the trench structure 30.

Figure 3:
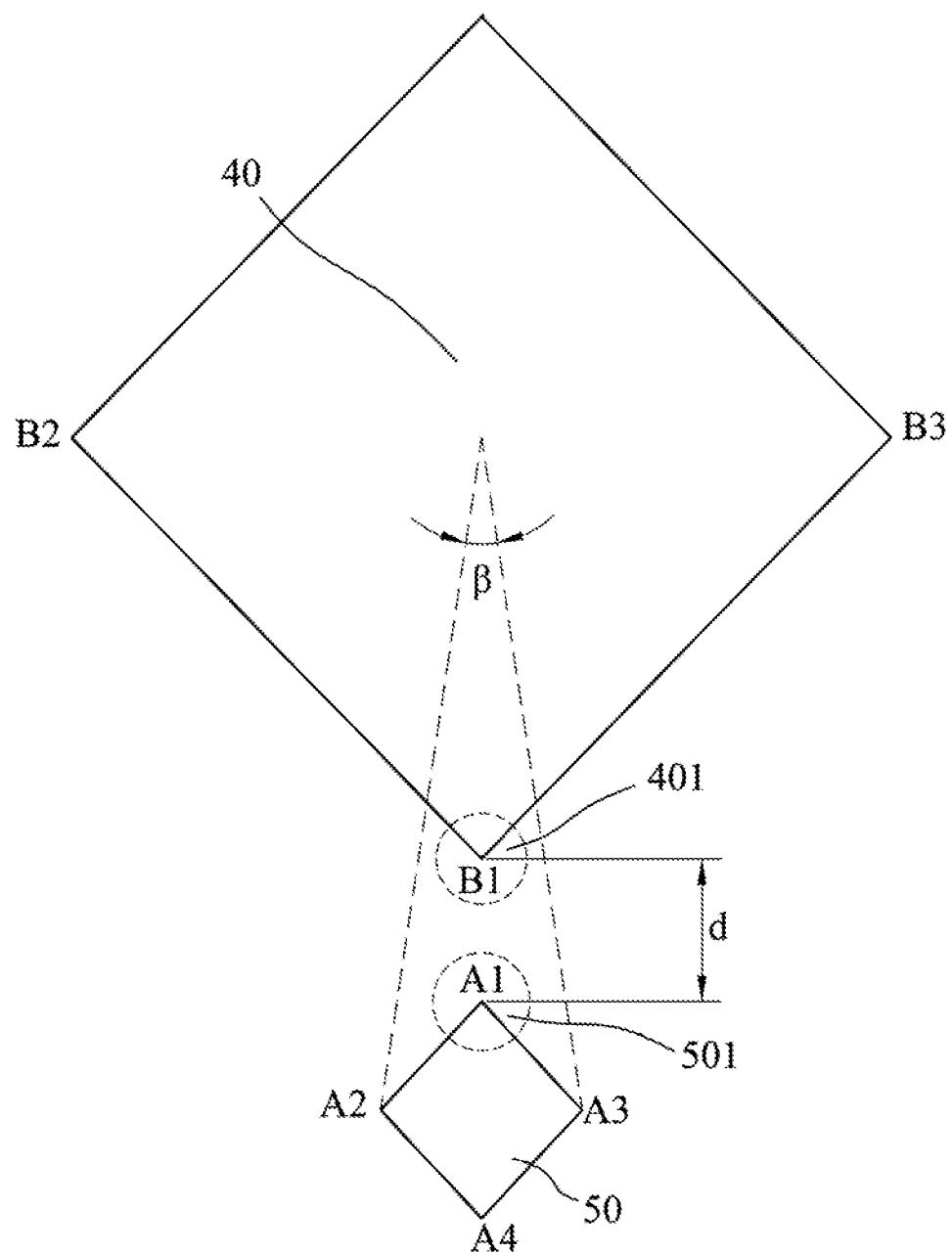
FIG. 3 is a schematic diagram illustrating a positional relationship between a first LED chip and an anti-electrostatic discharge element in a variation of the first embodiment.

Referring to FIG. 3, in a variation of the first embodiment, the projection of the anti-electrostatic discharge element 50 has a first vertex (A1) at a distance (d) from a nearest one (B1) of vertices of the projection of the first LED chip 40 nearest to the anti-electrostatic discharge element 50 that is smaller than a distance from each of the remaining vertices (A2, A3, A4) of the projection of the anti-electrostatic discharge element 50 to the nearest one (B1) of the vertices of the projection of the first light-emitting diode chip 40. In addition, the projection of the anti-electrostatic discharge element 50 has a second vertex (A2) and a third vertex (A3) neighboring the first vertex (A1) of the projection of the anti-electrostatic discharge element 50, and an included angle (β) defined between a first imaginary line that connects the second vertex (A2) and the centroid of the first LED chip 40 and a second imaginary line that connects the third vertex (A3) and the centroid of the first LED chip 40 is not smaller than 5° and not greater than 36°. The distance (d) between the first vertex (A1) of the projection of the anti-electrostatic discharge element 50 and the nearest one (B1) of the vertices of the projection of the first LED chip 40 may be not smaller than 0.2 mm.

As shown in FIG. 3, the projection of the anti-electrostatic discharge element 50 may have a first corner part 501 with the first vertex (A1) serving as a corner of the first corner part 501, i.e., the first corner part 501 includes the first vertex (A1) and a portion of two edges that respectively interconnect the first and second vertices (A1, A2) and the first and third vertices (A1, A3). The projection of the first LED chip 40 has a second corner part 401 with the nearest one (B1) of the vertices serving as a corner of the second corner part 401, i.e., the second corner part 401 includes the nearest one (B1) of the vertices and a portion of two edges that interconnect the B1 vertex and a respective one of two vertices (B2, B3) neighboring the B1 vertex. The first corner part 501 is aligned with and points toward the second corner part 401. In particular, when each of the projection of the first LED chip 40 on the electrically conductive layer 20 and the projection of the anti-electrostatic discharge element 50 on the electrically conductive layer 20 has a substantially square shape, a diagonal line of the projection of the anti-electrostatic discharge element 50 is collinear with a diagonal line of the projection of the first LED chip 40.

The glass cover plate 60 is disposed on the concavity-defining wall 12 and is configured to encapsulate the first LED chip 40 and the anti-electrostatic discharge element 50. The glass cover plate 60 may be made of a material which has a high light transmittance for light emitted from the first LED chip 40. Alternatively, encapsulation of the first LED chip 40 and the anti-electrostatic discharge element 50 may be conducted using an encapsulant (e.g., a resin) instead of the glass cover plate 60. In certain embodiments, an optical lens may further be disposed on the glass cover plate 60.

Figure 5:
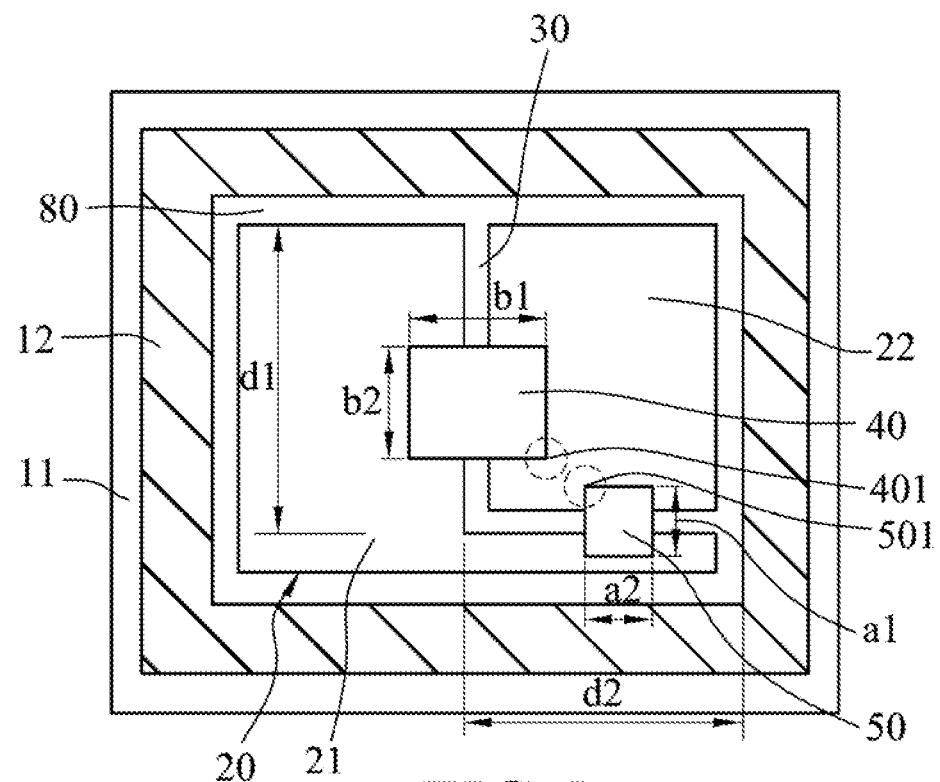
FIG. 5 is a schematic top view of a second embodiment of the LED device of the disclosure.

Referring to FIG. 5, a second embodiment of the LED device according to the disclosure is generally similar to the first embodiment and the variation thereof, except for the following differences.

To be specific, one of the surfaces of the first LED chip 40 nearest to the anti-electrostatic discharge element 50 has normal lines, and all points on the one of the side surfaces of the anti-electrostatic discharge element 50 nearest to the one of the side surfaces of the first LED chip 40 are not intersected by the normal lines. That is, the projection of the one of the surfaces of the first LED chip 40 nearest to the anti-electrostatic discharge element 50 on the anti-electrostatic discharge element 50 does not cover the one of the side surfaces of the anti-electrostatic discharge element 50 nearest to the one of the side surfaces of the first LED chip 40. In addition, in the second embodiment, the included angle between the diagonal line of the first LED chip 40 and the diagonal line of the substrate 10 is about 0°, and the trench structure 30 of the second embodiment has an "L" shape. The lengths of the first and second segments 301, 302 (d1, d2) satisfy relationships of: d1≥½×a1+b1 and d2≥a2+½×b1.

Figure 6:
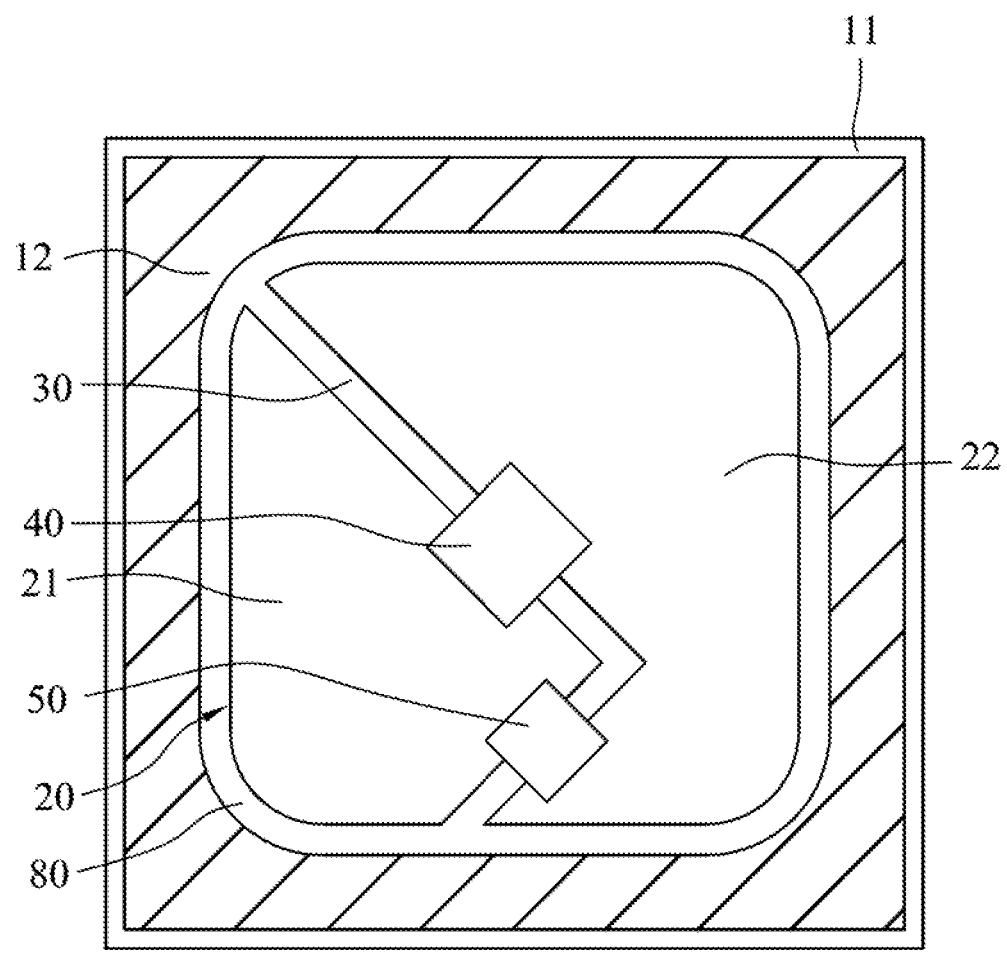
FIG. 6 is a schematic top view of a third embodiment of the LED device of the disclosure.

Referring to FIG. 6, a third embodiment of the LED device according to the disclosure is generally similar to the first embodiment, except that the trench structure 30 of the third embodiment has an inverted "L" shape, which may assist in the installation of the first LED chip 40.

Figure 7:
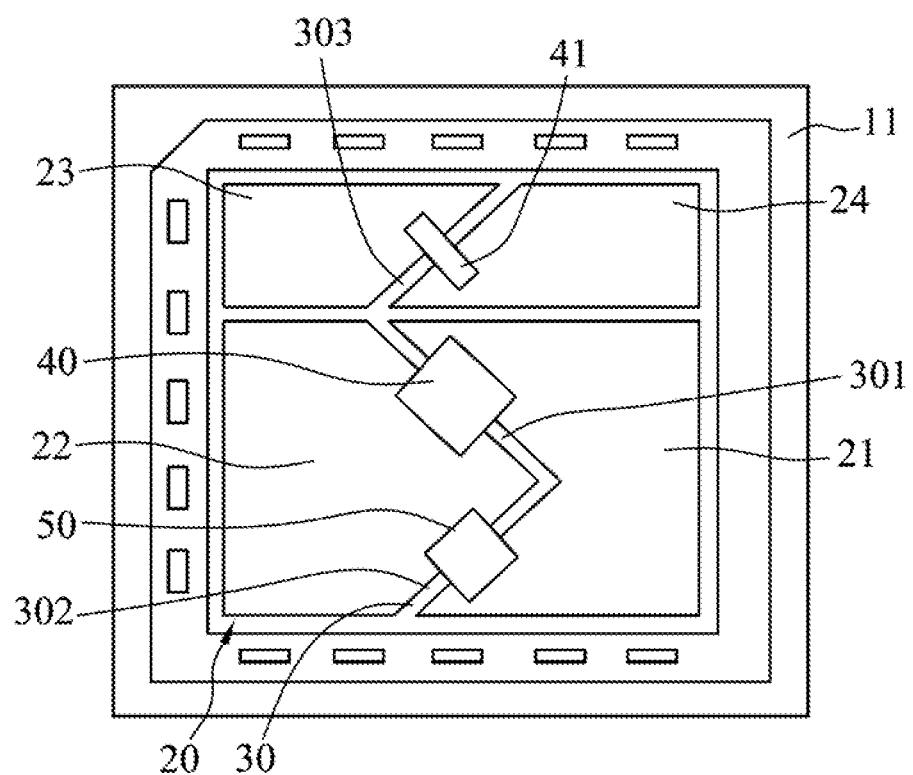
FIG. 7 is a schematic top view of a fourth embodiment of the LED device of the disclosure.

Referring to FIG. 7, a fourth embodiment of the LED device according to the disclosure is generally similar to the first embodiment, except for the following differences.

To be specific, the LED device of the fourth embodiment further includes a second LED chip 41, and the electrically conductive layer 20 of the fourth embodiment further includes a third region 23 and a fourth region 24 that are electrically separated from each other and from the first region 21 and the second region 22 by the trench structure 30. The trench structure 30 may further have a third segment 303 which connects and is not collinear with one of the first and second segments 301, 302, and which separates the third and fourth regions 23, 24.

In this embodiment, the third segment 303 connects and is not collinear with the first segment 301, and the second LED chip 41 is disposed across the third segment 303 and interconnects the third region 23 and the fourth region 24. In other words, the first LED chip 40 is disposed between the second LED chip 41 and the anti-electrostatic discharge element 50 in such a manner that the anti-electrostatic discharge element 50 is not directly irradiated by light emitted from the second LED chip 41. In addition, the substrate 10 is a flat plate without the concavity 13, and the electrically conductive layer 20, the first and second LED chips 40, 41, and the anti-electrostatic discharge element 50 are disposed on the upper surface of the substrate 10. Since the third and fourth regions 23, 24 of the electrically conductive layer 20 are electrically separated from the first and second regions 21, 22, the second LED chip 41 may be electrically separated from the first LED chip 40.

Alternatively, in other embodiments, the third segment 303 connects and is not collinear with the second segment 302. That is, the anti-electrostatic discharge element is disposed between the first LED chip 40 and the second LED chip 41. The arrangement relationship between the second LED chip 41 and the anti-electrostatic discharge element 50 may be varied as those described for the first LED chip 40 and the anti-electrostatic discharge element 50 in the above-mentioned embodiments.

In sum, by controlling the positional relationship between the first LED chip and the anti-electrostatic discharge element of the LED device in this disclosure, the amount of light and heat emitted from the first LED chip to be absorbed by a side surface of the anti-electrostatic discharge element can be greatly reduced, which may prevent the malfunction of the anti-electrostatic discharge element, thereby improving light extraction efficiency of the LED device and uniformity of light emitted therefrom.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode device, comprising:
    a substrate having opposite upper and lower surfaces;
    an electrically conductive layer formed on said upper surface of said substrate, and having a first region and a second region that are electrically separated from each other by a trench structure, said trench structure having a first segment and a second segment which connects and is not collinear with said first segment;
    a first light-emitting diode chip disposed across said first segment of said trench structure and interconnecting said first and second regions of said electrically conductive layer; and
    an anti-electrostatic discharge element disposed across said second segment of said trench structure and interconnecting said first and second regions of said electrically conductive layer;
    wherein an included angle between said first segment and said second segment of said trench structure is within a range of 60° to 120°;
    wherein each of a projection of said first light-emitting diode chip on said electrically conductive layer and a projection of said anti-electrostatic discharge element on said electrically conductive layer has a substantially rectangular shape;
    wherein said first segment and said second segment of said trench structure respectively have a first length (d1) and second length (d2) which satisfy relationships of $$d1 \geq b2 + \frac{|a1 + b1\cos\alpha|}{2\sin\alpha}, \text{ and}$$

$$d2 \geq a2 + \frac{|b1 + a1\cos\alpha|}{2\sin\alpha} + \frac{a1}{2\tan(\alpha - \frac{\pi}{4})},$$

where $\alpha$ represents an included angle defined between said first segment and said second segment, a1 and a2 respectively represent a length and a width of said anti-electrostatic discharge element, and b1 and b2 respectively represent a length and a width of said first light-emitting diode chip; and
    wherein an included angle between a diagonal line of said first light-emitting diode chip and a diagonal line of said substrate is within a range of 30° to 60°.

2. The light-emitting diode device according to claim 1, wherein each of said first light-emitting diode chip and said anti-electrostatic discharge element has side surfaces and edges interconnecting said side surfaces, one of said side surfaces of said first light-emitting diode chip nearest to said anti-electrostatic discharge element having normal lines that intersect with all points on a nearest one of said side surfaces of said anti-electrostatic discharge element, an intersecting angle between any one of said normal lines and said nearest one of said side surfaces of said anti-electrostatic discharge element being not equal to 90°.

3. The light-emitting diode device according to claim 1, wherein each of said first light-emitting diode chip and said anti-electrostatic discharge element has side surfaces and edges interconnecting said side surfaces, one of said side surfaces of said first light-emitting diode chip nearest to said anti-electrostatic discharge element having normal lines, not all points on one of said side surfaces of said anti-electrostatic discharge element nearest to said one of said side surfaces of said first light-emitting diode chip being intersected by said normal lines.

4. The light-emitting diode device according to claim 1, wherein said substrate has a concavity-defining wall extending away from said upper surface to define a concavity, said electrically conductive layer, said first light-emitting diode chip, and said anti-electrostatic discharge element being received in said concavity.

5. The light-emitting diode device according to claim 4, wherein said concavity of said substrate has a bottom wall in a substantially rectangular shape, and said first segment of said trench structure is aligned with a diagonal line of said bottom wall of said concavity.

6. The light-emitting diode device according to claim 1, wherein the projection of said anti-electrostatic discharge element has a first vertex at a distance from a nearest one of vertices of the projection of said first light-emitting diode chip nearest to said anti-electrostatic discharge element that is smaller than a distance from each of the remaining vertices of the projection of said anti-electrostatic discharge element to said nearest one of said vertices of the projection of said first light-emitting diode chip.

7. The light-emitting diode device according to claim 6, wherein the projection of said anti-electrostatic discharge element has a first corner part with said first vertex that serves as a corner of said first corner part, the projection of said first light-emitting diode having a second corner part with said nearest one of said vertices serving as a corner of said second corner part, said first corner part being aligned with and pointing toward said second corner part.

8. The light-emitting diode device according to claim 7, wherein a diagonal line of the projection of said anti-electrostatic discharge element is collinear with a diagonal line of the projection of said first light-emitting diode.

9. The light-emitting diode device according to claim 6, wherein said distance between said first vertex of the projection of said anti-electrostatic discharge element and said nearest one of said vertices of the projection of said first light-emitting diode chip is not smaller than 0.2 mm.

10. The light-emitting diode device according to claim 6, wherein the projection of said anti-electrostatic discharge element has a second vertex and a third vertex neighboring said first vertex of the projection of said anti-electrostatic discharge element, and an included angle defined between a first imaginary line that connects said second vertex and a centroid of said first light-emitting diode chip and a second imaginary line that connects said third vertex and said centroid of said first light-emitting diode chip is not lower than 5° and not greater than 36°.

11. The light-emitting diode device according to claim 1, wherein each of said first light-emitting diode chip and said substrate has a substantially rectangular shape, said first light-emitting diode chip being disposed at a centroid of said substrate, an included angle between a diagonal line of said first light-emitting diode chip and a diagonal line of said substrate being within a range of 30° to 60°.

12. The light-emitting diode device according to claim 1, wherein said first light-emitting diode chip is a flip chip configured to emit light having a wavelength within a range of 200 nm to 380 nm.

13. The light-emitting diode device according to claim 1, wherein said anti-electrostatic discharge element includes two electrodes facing said electrically conductive layer and reflective layers coated on a side surface and an upper surface of said anti-electrostatic discharge element opposite to said electrically conductive layer.

14. The light-emitting diode device according to claim 1, wherein:
said electrically conductive layer further has a third region and a fourth region that are electrically separated from each other and from said first region and said second region by said trench structure, said trench structure further having a third segment which connects and is not collinear with one of said first and second segments and which separates said third and fourth regions; and
said light-emitting diode device further comprises a second light-emitting diode chip that is disposed across said third segment and that interconnects said third region and said fourth region.

15. The light-emitting diode device according to claim 14, wherein said third segment of said trench structure connects and is not collinear with said first segment in such a manner that said anti-electrostatic discharge element is not directly irradiated by light emitted from said second light-emitting diode chip.

16. The light-emitting diode device according to claim 14, wherein said third segment of said trench structure connects and is not collinear with said second segment, and each of said second light-emitting diode chip and said anti-electrostatic discharge element has side surfaces and edges interconnecting said side surfaces, one of said side surfaces of said second light-emitting diode chip nearest to said anti-electrostatic discharge element having normal lines that intersect with all points on a nearest one of said side surfaces of said anti-electrostatic discharge element, an intersecting angle between any one of said normal lines and said nearest one of said side surfaces of said anti-electrostatic discharge element being not equal to 90°.

17. The light-emitting diode device according to claim 14, wherein said third segment of said trench structure connects and is not collinear with said second segment, and each of said second light-emitting diode chip and said anti-electrostatic discharge element has side surfaces and edges interconnecting said side surfaces, one of said side surfaces of said second light-emitting diode chip nearest to said anti-electrostatic discharge element having normal lines, not all points on one of said side surfaces of said anti-electrostatic discharge element nearest to said one of said side surfaces of said second light-emitting diode chip being intersected by said normal lines.

* * * * *